United States Patent [19]
Yamamoto

[11] Patent Number: 5,592,040
[45] Date of Patent: Jan. 7, 1997

[54] ACOUSTIC WAVE RESONATOR FILTER

[75] Inventor: Yasushi Yamamoto, Tokyo, Japan

[73] Assignee: NEC Corporation, Tokyo, Japan

[21] Appl. No.: 419,764

[22] Filed: Apr. 10, 1995

Related U.S. Application Data

[63] Continuation of Ser. No. 110,997, Aug. 24, 1993, abandoned.

[30] Foreign Application Priority Data

Aug. 24, 1992 [JP] Japan ................................ 4-223698

[51] Int. Cl.$^6$ ............................................. H03H 9/64
[52] U.S. Cl. ................... 310/313 D; 310/313 R; 333/195
[58] Field of Search .................... 310/313 R, 313 B, 310/313 D; 333/187, 189, 193, 195

[56] References Cited

U.S. PATENT DOCUMENTS

| | | | |
|---|---|---|---|
| 3,987,379 | 10/1976 | DeVries | 310/313 R |
| 3,988,703 | 10/1976 | DeVries | 310/313 R |
| 4,060,777 | 11/1977 | Tiersten et al. | 310/366 |
| 4,178,571 | 12/1979 | Mitchell | 333/195 |
| 4,350,963 | 9/1982 | Iwamoto et al. | 310/313 D |
| 4,583,047 | 4/1986 | Le Goff et al. | 333/193 |
| 4,590,442 | 5/1986 | Saito | 333/193 |
| 4,661,738 | 4/1987 | Skeie | 310/313 D |

FOREIGN PATENT DOCUMENTS

| | | | |
|---|---|---|---|
| 0545672 | 6/1993 | European Pat. Off. | 333/195 |
| 14214122 | 11/1993 | Germany | 310/313 R |
| 0000213 | 1/1984 | Japan | 333/195 |
| 0037723 | 3/1984 | Japan | 333/195 |
| 0142812 | 6/1986 | Japan | 333/195 |
| 0034715 | 2/1991 | Japan | 333/195 |
| 13278606 | 12/1991 | Japan | 333/195 |
| 13278608 | 12/1991 | Japan | 333/195 |
| 14113712 | 4/1992 | Japan | 333/193 |
| 1512790 | 6/1978 | United Kingdom | 333/193 |
| 9109465 | 6/1991 | WIPO | 333/195 |
| 9111856 | 8/1991 | WIPO | 333/193 |

OTHER PUBLICATIONS

M. Takao et al., Widebande Low Loss Double Mode Saw Filters, Ultrasonic Synposium, IEEE, 1992.

M. Tanaka et al., Narrow Bandpass Filter Using Double-Mode Saw Resonators On Quartz, 38th Annual Frequency Control Synposium, IEEE, 1984.

M. Tanaka et al., Narrow Bandpass Double Mode Saw Filter, 15th EM Symposium of Electlic Communication Committee in Japan, 1986.

IEEE988Ultras. Symp. Proc; 2–5 Oct. 1988; pp. 195–202; Yasuo Ebata et al; Current Applications And Future Trends For Saw In Asia.

Primary Examiner—Thomas M. Dougherty
Attorney, Agent, or Firm—Sughrue, Mion, Zinn, Macpeak & Seas

[57] ABSTRACT

A surface acoustic wave resonator filter includes an interdigital electrode on a piezoelectric substrate and has a two-dimensional mode coupling structure coupling a longitudinal resonation in the longitudinal direction consistent with a propagating direction of a surface acoustic wave and a transversal mode resonation in a transverse direction perpendicular to the propagating direction.

2 Claims, 8 Drawing Sheets

ACOUSTIC WAVE RESONATOR FILTER

This is a Continuation of application Ser. No. 08/110,997 filed Aug. 24, 1993, now abandoned.

BACKGROUND OF THE INVENTION

Field of the Invention

The present invention relates to a surface acoustic wave resonator filter. More specifically, the invention relates to a band-pass filter of the type of a surface acoustic wave (SAW) resonator utilizing a longitudinal mode resonance of a surface acoustic wave and having a wide band characteristics.

An equivalent circuit of the conventional two pole mode SAW resonator is illustrated in FIG. 7A. It has been known that such SAW resonator includes two series resonating circuits 11 and 12 having frequencies $f_{11}$ and $f_{12}$. The phases of two resonating frequencies $f_{11}$ and $f_{12}$ are in opposite phase relationship. This opposite phase relationship is equivalently illustrated by a transformer 13.

When an impedance matching is established in the two pole mode SAW resonators under a certain condition, a filter characteristics as illustrated in FIG. 7B is obtained with a pass band between the resonance frequencies $f_{11}$ and $f_{12}$. A center frequency in the pass band is $f_t$. As a typical filter employing this principle, a monolithic quartz filter has been well known. With such filter construction, each insertion loss at the resonance frequencies $f_{11}$ and $f_{12}$ becomes substantially consistent with 3 dB point attenuating 3 dB from a minimum insertion loss (generally 0 dB) of the pass band.

As conventional means for realizing such two pole mode resonator, there are a longitudinal mode resonation type for generating two resonance modes in a propagating direction of the surface acoustic wave and a transversal mode type for generating two resonance modes in a direction transverse to the propagating direction. This two pole mode resonator has been disclosed in M. Tanaka et al., *"NARROW BANDPASS FILTER USING DOUBLE-MODE SAW RESONATORS ON QUARTZ"* in the 38th Annual Frequency Control Symposium of IEEE, 1984, and M. Tanaka et al., *"Narrow Bandpass Double Mode SAW Filter"*, of the 15th EM Symposium of Electric Communication Committee, 1986.

FIGS. 8A and 8B show the concrete construction of this two pole mode resonator. FIG. 8A shows a transversal mode coupling type filter, in which two resonators a and b are proximately arranged longitudinally perpendicular to the propagating direction of the surface acoustic wave. The resonator a has an IDT (interdigital) electrode 1a at a center and reflectors 3a and 4a at both sides of the IDT electrode 1a. Similarly, the resonator b has an IDT electrode 1b at the center and reflectors 3b and 4b at both sides of the IDT electrode 1b.

In this transversal mode coupling type filter, the band-pass filter characteristics as shown in FIG. 7B is obtained by a coupling of two modes (even symmetric mode illustrated by $f_1$ and odd symmetric mode illustrated by $f_2$).

FIG. 8B shows a longitudinal mode coupling type filter, in which two IDT electrodes 1 and 2 are proximately arranged in the longitudinal direction as the propagating direction of the surface acoustic wave. At both sides of these IDT electrodes 1 and 2, reflectors 3 and 4 are arranged respectively.

With this longitudinal mode coupling type filter, the band-pass filter characteristics as illustrated in FIG. 7B is obtained by the coupling of two modes generated between the input side IDT electrode 1 and the output side IDT electrode 2.

In such type of the surface acoustic wave filter, it is necessary to expand the interval between the resonance frequencies of two modes to be used in order to widen the filter characteristics. There is a restriction on the design parameter to cause various problems, such as large use impedance, degradation of the attenuation magnitude out of the band and so forth. Therefore, there is a limitation for widening the band.

SUMMARY OF THE INVENTION

Therefore, it is an object of the present invention to provide a surface acoustic wave resonator filter which permits widening of bands with simple construction.

According to one aspect of the invention, a surface acoustic wave resonator filter includes an interdigital electrode on a piezoelectric substrate, and has a two-dimensional mode coupling structure coupling a longitudinal resonation in the longitudinal direction consistent with a propagating direction of a surface acoustic wave and a transversal mode resonation in a transverse direction perpendicular to the propagating direction.

The two-dimensional coupling type structure may be formed by proximately arranging first and second longitudinal mode coupling type resonators on the piezoelectric substrate for establishing transversal coupling.

According to another aspect of the invention, a surface acoustic wave resonator filter including an interdigital electrode on a piezoelectric substrate, comprises first and second longitudinal mode coupling type resonators utilizing longitudinal mode resonation in the longitudinal direction consistent with a propagating direction of a surface acoustic wave, the first and second longitudinal mode coupling type resonators being established a parallel connection between inputs and outputs thereof.

BRIEF DESCRIPTION OF THE DRAWINGS

The present invention will be understood more fully from the detailed description given herebelow and from the accompanying drawings of the preferred embodiment of the invention, which, however, should not be taken limitative to the present invention, but are for explanation and understanding only.

In the drawings.

DESCRIPTION OF THE REFERRED EMBODIMENT

Figure 1A:
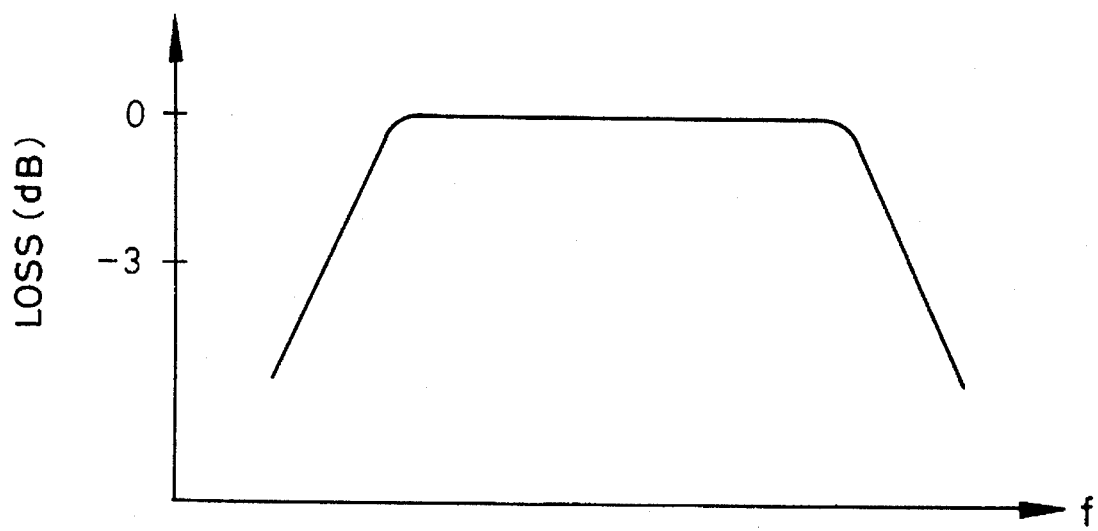
FIGS. 1A and 1B are illustration respectively showing filter characteristics of the present invention.
Figure 1B:
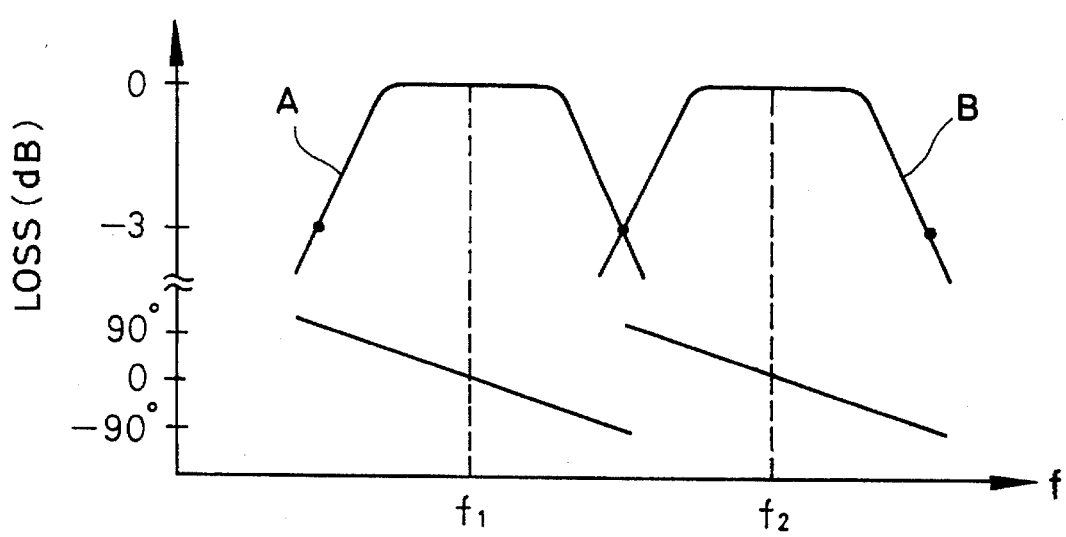
Figure 2A:
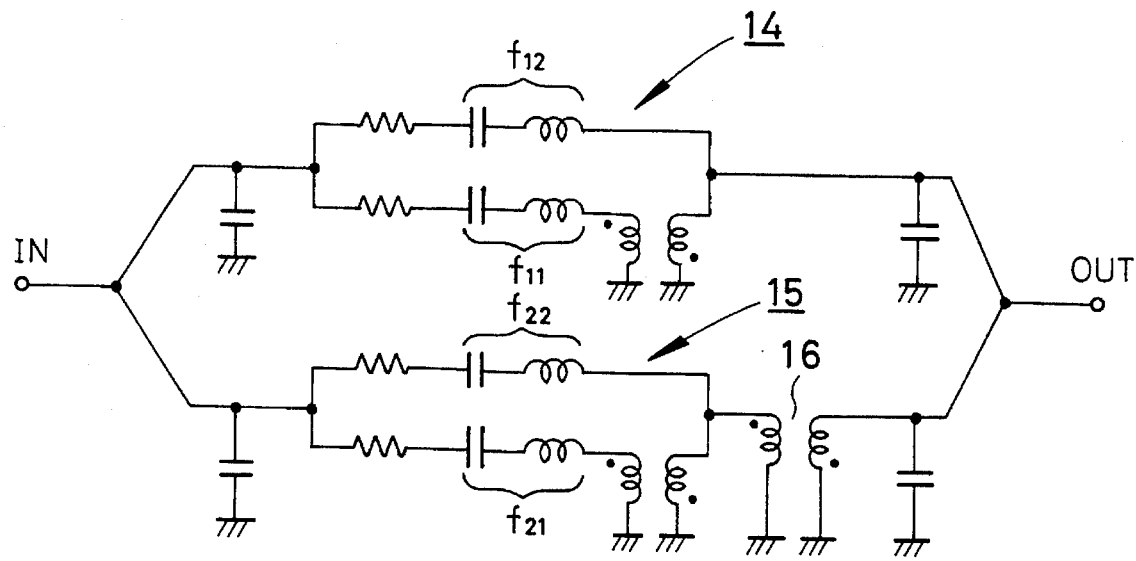
FIG. 2A is an equivalent circuit diagram of a filter according to the present invention.

Initially, consideration is given for the case where is a two pole mode SAW resonator A having resonance frequencies $f_{11}$ and $f_{12}$ and a two pole mode resonator B having resonance frequencies $f_{21}$ and $f_{22}$. When an impedance matching is established for the filter, a filter characteristics becomes as illustrated in FIG. 1B, assuming the center frequencies in the pass-bands are respectively $f_1$ and $f_2$. In order to establish a single filter characteristics as illustrated in FIG. 1A by combining these two filter characteristics A and B, it is essential conditions that, in the cross point of these two characteristics A and B, the power of each output signal of each filter is half of the power of the output signal of the pass band and that the two signals are in the same phase. The equivalent circuit of the resonators A and B satisfying these essential conditions is as illustrated in FIG. 2A. The equivalent circuit of the resonator A has a parallel connection 14 of the series resonating circuit having resonance frequencies $f_{11}$ and $f_{12}$. Similarly, the equivalent circuit of the resonator B has a parallel connection of a series resonating circuit having resonance frequencies $f_{21}$ and $f_{22}$.

Figure 2B:
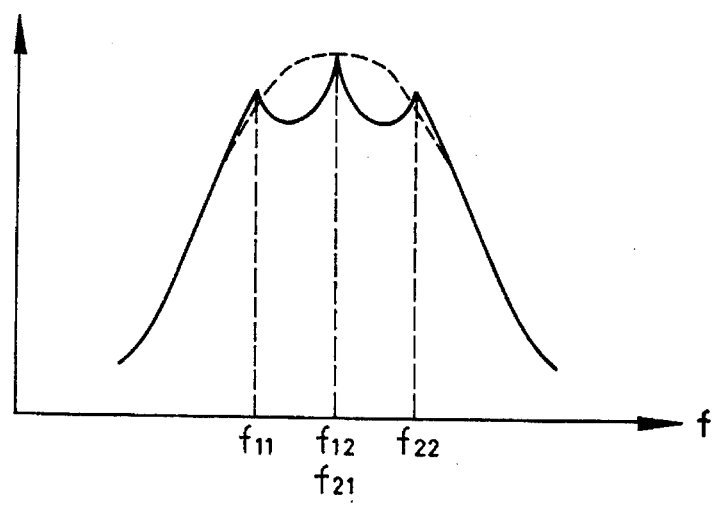
FIG. 2B is a characteristic chart of the filter of the invention.

Then, the output signals on the high band side resonance frequency $f_{12}$ of the resonator A and the low band side resonance frequency $f_{21}$ of the resonator B are to be matched to each other in the vector sense (both in the power and phase). This relationship is illustrated in the transformer 16. At this time, the composite resonance characteristics becomes as illustrated in FIG. 2B. Then, the filter characteristics with established impedance matching becomes wide band as illustrated in FIG. 1A.

Figure 3A:
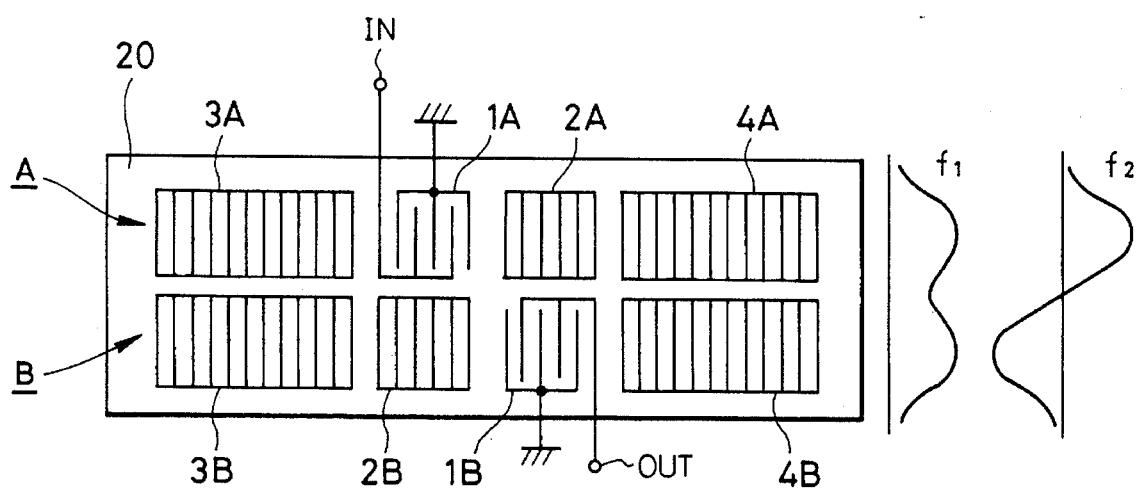
FIG. 3A is an illustration showing a construction of one embodiment of the present invention.

The embodiment of the filter construction of the present invention satisfying the above-mentioned characteristics is illustrated in FIG. 3A. As shown in FIG. 3A, the shown embodiment is constructed by two sets of longitudinal mode coupling type resonators illustrated in FIG. 8B proximately arranged in the transverse direction and transversal mode coupling being acoustically established between these two resonators. Namely, the SAW filter according to the invention is designed in a two-dimensional mode coupling type structure by coupling the longitudinal mode resonation in the longitudinal direction as the propagating direction of the surface acoustic wave and the transversal mode resonation in the transverse direction perpendicular to the propagating direction.

In the construction shown in FIG. 3A, two longitudinal mode coupling type resonators A and B are arranged on a piezoelectric substrate 20 in a cross proximity to each other for permitting acoustical transversal mode coupling. AN Input IDT electrode 1A and a dummy electrode 2A are arranged in the longitudinal direction. Also, reflectors 3A and 4A are arranged at respective sides thereof. The IDT electrode 1A, the dummy electrode 2A and reflectors 3A and 4A form the first longitudinal mode resonator A.

An output IDT electrode 1B and a dummy electrode 2B are also arranged in the longitudinal direction. Reflectors 3B and 4B are arranged at respective sides. The IDT electrode 1B, the dummy electrode 2B and the reflectors 3B and 4B form the second longitudinal mode resonator B.

Figure 8A:
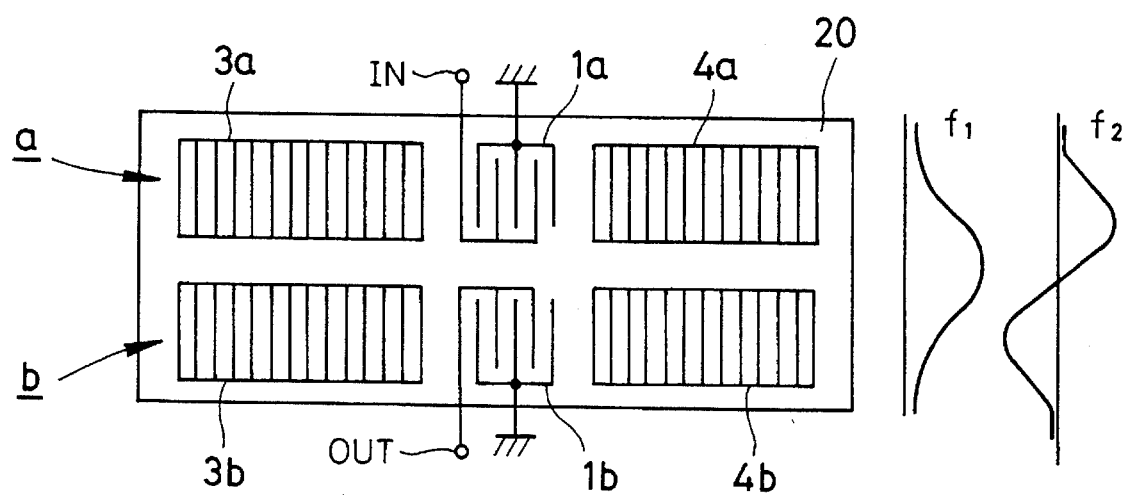
FIG. 8A is an illustration showing a construction of the conventional transversal mode coupling type filter.
Figure 8B:
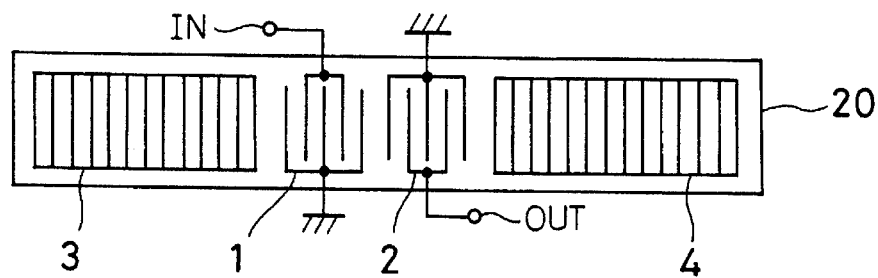
FIG. 8B is an illustration showing a construction of the conventional longitudinal mode coupling type filter.

It should be noted that the dummy electrodes 2A and 2B correspond to a single IDT electrode of the longitudinal resonator illustrated in FIG. 8B and have acoustically equivalent function to the IDT electrode. Further discussion will be given for these dummy electrodes 2A and 2B. In the structure of FIG. 3A, the transversal mode coupling is the same as the transversal mode coupling between adjacent two grating waveguides, similar to the transversal mode coupling type resonator of FIG. 8A. On the other hand, the longitudinal mode coupling utilizes resonance mode by a multiple reflection between the reflectors 3 and 4, resonance mode by multiple reflection between the IDT electrodes, and further resonance mode within the IDT electrode, similar to the longitudinal mode coupling type resonator illustrated in FIG. 8B.

The dummy electrodes 2A and 2B in the structure of FIG. 3A have equivalent structure to the IDT electrodes except for the structure of electrically shorting the IDT electrodes. Therefore, in the structure where two resonators A and B are adjacent in the transverse direction, both resonators A and B become equivalent to a uniform grating wave guide for the presence of the dummy electrodes 2A and 2B. Therefore, the desired transversal mode coupling can be obtained.

On the other hand, observing as the coupling in the longitudinal direction, it is necessary that the dummy electrodes 2A and 2B are acoustically equivalent to the IDT electrodes. Because of presence of the dummy electrodes, the multiple reflecting resonation between the reflectors, the multiple reflecting resonation between the IDT electrodes, and the resonation of the IDT electrode per se, as the longitudinal mode resonation can be utilized as in the longitudinal mode coupling type resonator.

Although the electrodes are arranged to generate two longitudinal mode resonation in the longitudinal direction, SAW propagation in even symmetric mode ($f_l$) and odd symmetric mode ($f_2$) in the transverse direction so that two transversal mode characteristics can be obtained in the even symmetric mode and odd symmetric mode.

This is illustrated in a form of the equivalent circuit as shown in FIG. 2A, in which the resonating circuit 14 represents the even symmetric mode and the resonating circuit 15 represents odd symmetric mode. Respective resonating circuits 14 and 15 have two series resonating circuits having two longitudinal modes.

In the shown construction, it is necessary to establish matching as shown in FIG. 2B between the higher side longitudinal mode resonation $f_{12}$ of the even symmetric mode and the lower side longitudinal mode resonation $f_{21}$ of the odd symmetric mode. This can be achieved by appropriately selecting the number of IDT pairs N, the longitudinal mutual interval between the IDT electrodes, longitudinal distances between the IDT electrode and the reflectors.

Figure 4A:
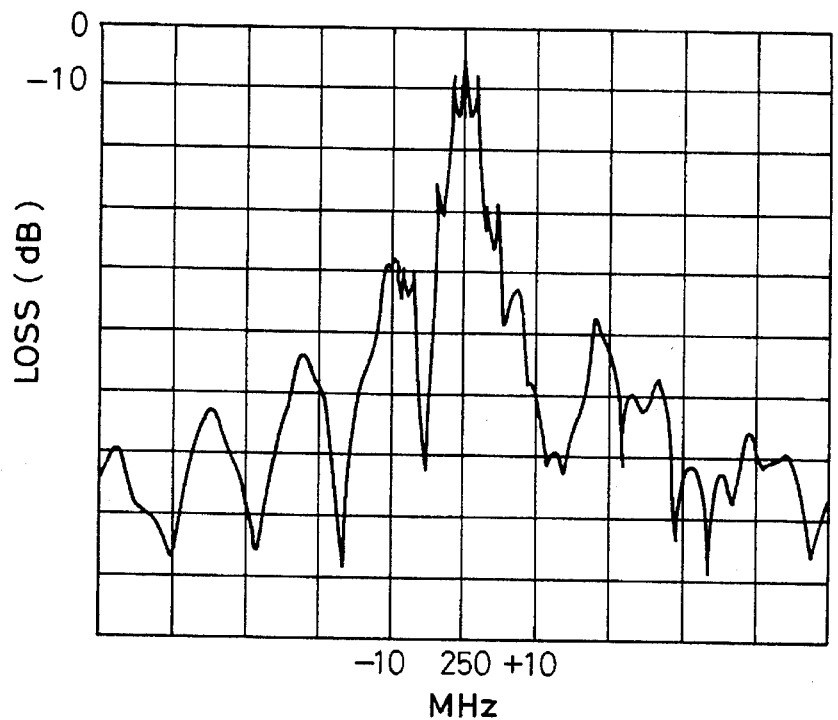
FIGS. 4A and 4B show results of actual measurement of filter characteristics of one embodiment of the invention.
Figure 4B:
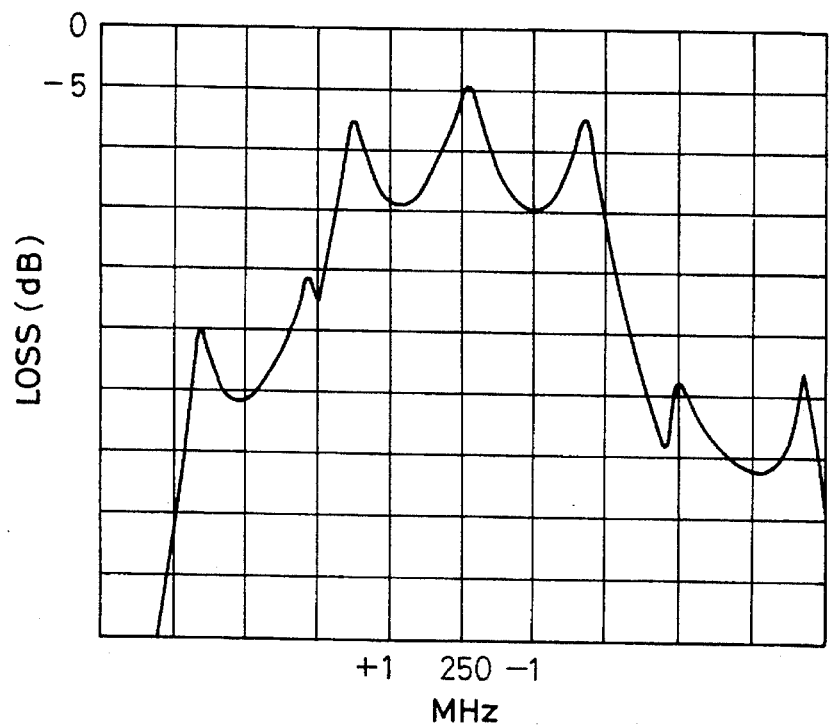
Figure 5A:
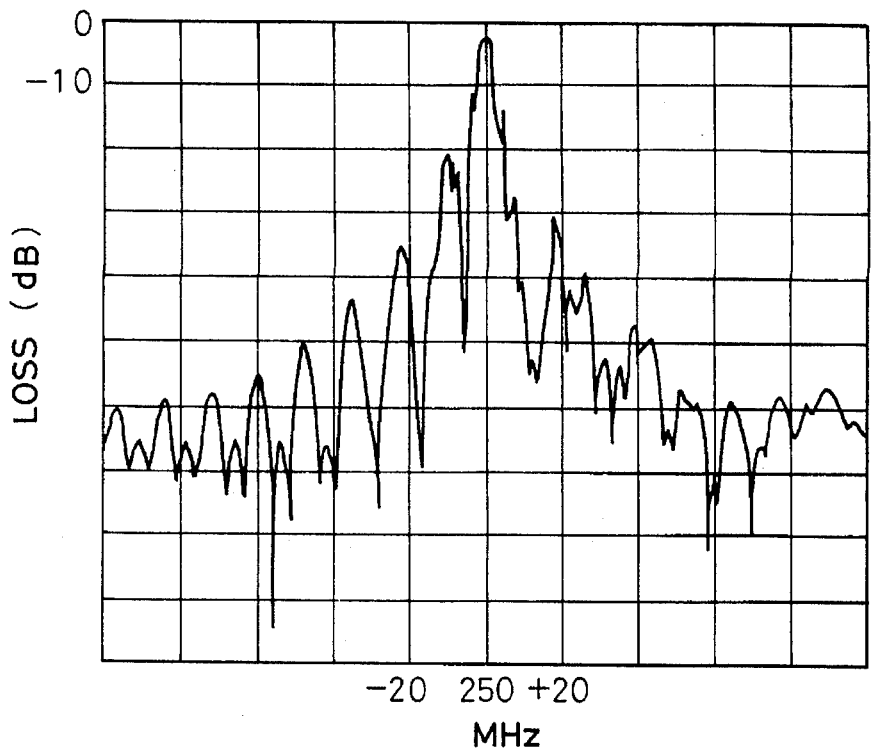
FIGS. 5A and 5B show results of actual measurement of the characteristics in case that another embodiment of the filter according to the invention is used for impedance matching.
Figure 5B:
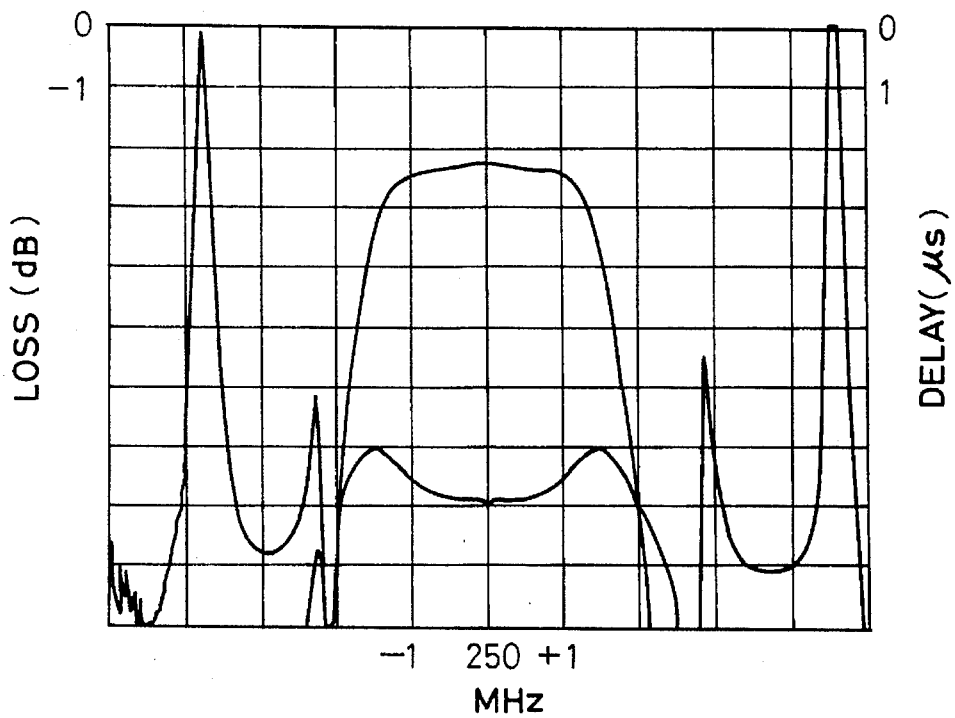

With the construction set forth above, the composite resonance characteristics shown in FIG. 2B can be obtained. The results of actual measurement are shown in FIGS. 4A and 4B. FIG. 4B shows in enlarged scale the frequency range near 250 MHz. When the filter of FIG. 3A is used with matched impedance, a flat characteristics in the pass band can be obtained as illustrated in FIGS. 5A and 5B. It should be noted that FIG. 5B shows in enlarged scale the frequency range near 250 MHz.

The shown SAW filter employs a ST cut quartz substrate, which exhibits capability of increasing of band width to 0.15% of relative band (3 dB band/center frequency) whereas the conventional relative band has been approximately 0.1%. Furthermore, as can be appreciated from the equivalent circuit of FIG. 2A, since the phase is reversed between the even symmetric mode and the odd symmetric mode (by transformer 16), attenuation rate can be improved for mutual cancellations of the signals of respective modes in the frequency range out of the pass band.

Figure 3B:
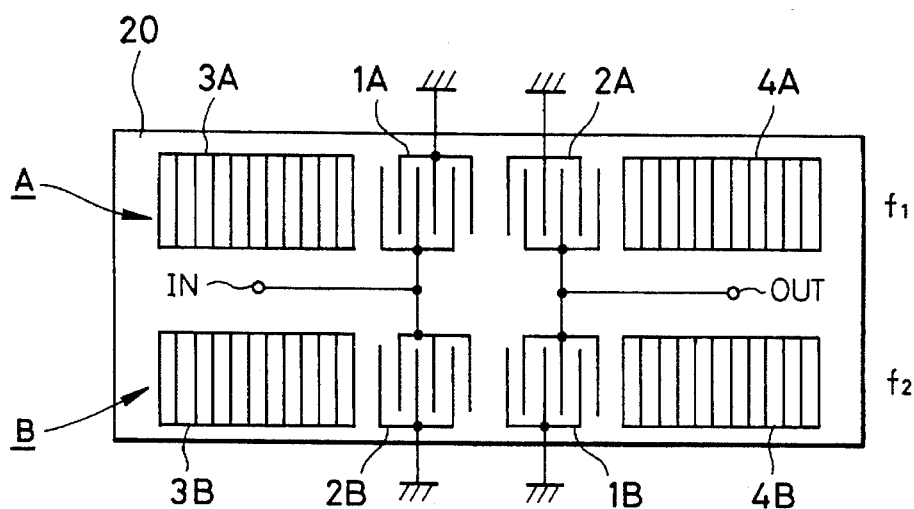
FIG. 3B iS an illustration showing a construction of another embodiment of the invention.

FIG. 3B shows another embodiment of the SAW filter according to the present invention. In this embodiment, a parallel connection is established between input and output of two longitudinal mode coupling type resonators A and B. The transversal mode is considered to be established by electrical coupling.

The resonator A comprises a pair of IDT electrodes 1A and 2A, and reflectors 3A and 4A at both sides thereof. Also, the resonator B comprises a pair of IDT electrodes 1B and 2B, the reflectors 3B and 4B at both sides thereof. The IDT electrodes 1A and 2B are electrically connected, and the IDT electrodes 2A and 1B are electrically connected to each other. As a results, two resonators A and B are connected in parallel between the input IN and the output OUT.

Even in this construction, the equivalent circuit the same as FIG. 2A can be established. Here, it becomes necessary that the signals from two resonators have to have opposite phase relationship. Therefore, in FIG. 3B, the relationship of the polarities of the IDT electrodes of the resonators A and B are selected to be opposite to each other. Namely, upper intersecting electrodes of the IDT electrodes 1A and 2A are grounded so that lower intersecting electrodes of the IDT electrodes 1B and 2B are grounded.

On the other hand, as another method, an opposite phase relationship of signals of two resonators A and B can be established by shifting an interval between the IDT electrodes 1B and 2B of the resonator B for n/2 (n is odd integer) wavelength relative to the interval between the IDT electrodes 1A and 2A of the resonator A.

Figure 6A:
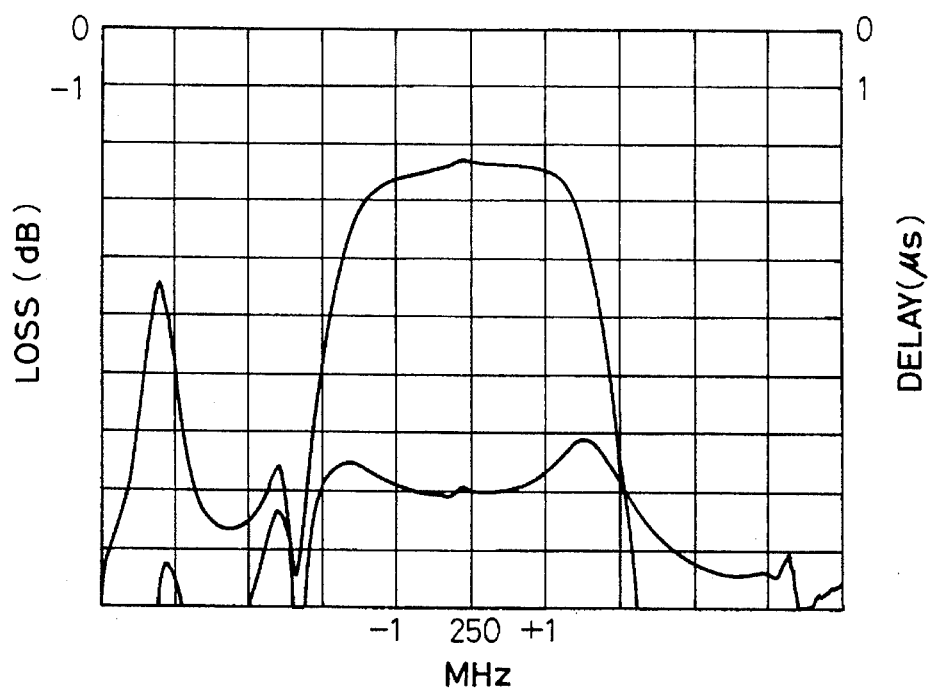
FIGS. 6A and 6B show results of actual measurement of the characteristics in case that another embodiment of the filter according to the invention is used for impedance matching.
Figure 6B:
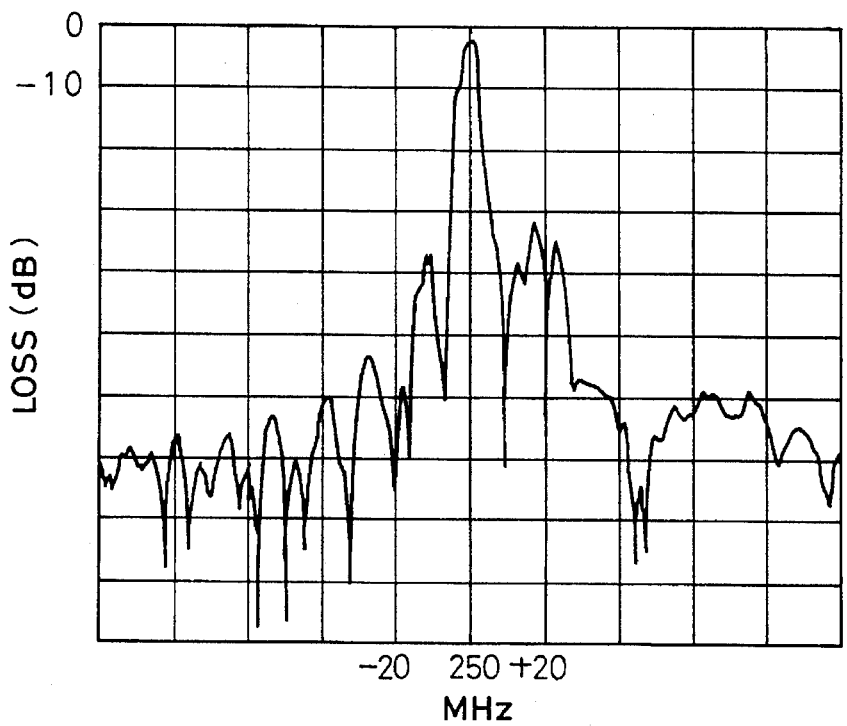
Figure 7A:
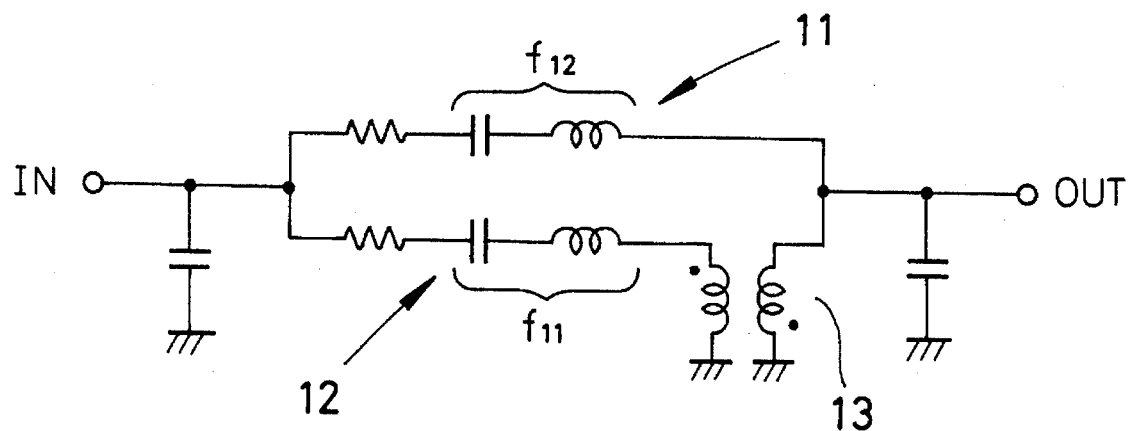
FIG. 7A is an equivalent circuit diagram of the conventional SAW resonator.
Figure 7B:
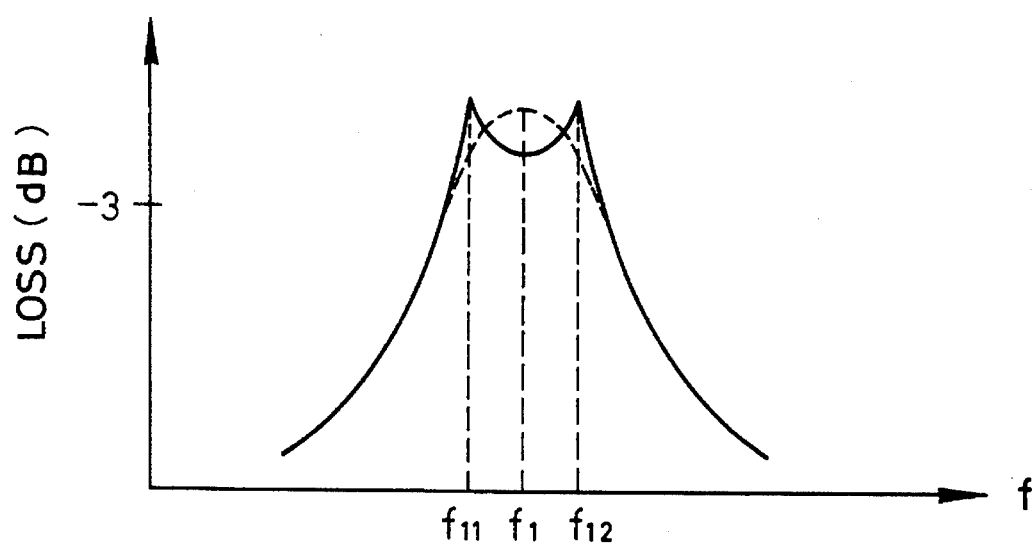
FIG. 7B is an illustration of a characteristics of the conventional SAW resonator.

FIGS. 6A and 6B show results of actual measurement of the characteristics for the filter having the structure of FIG. 3B. It should be noted that FIG. 6A is illustrated in the expanded scale for the frequency range near 250 MHz.

As set forth above, according to the present invention, it becomes possible to widen the band of the filter characteristics by acoustically or electrically coupling two pole modes SAW resonators and composing the characteristics of two resonators of the frequency axis.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A surface acoustic wave resonator filter comprising:
   a substrate having a piezoelectric surface;
   an input terminal and an output terminal;
   a first longitudinal mode coupling type resonator disposed on said piezoelectric surface of said substrate and connected to said input terminal;
   a second longitudinal mode coupling type resonator disposed on said piezoelectric surface of said substrate and connected to said output terminal;
   wherein said first longitudinal mode coupling type resonator comprises:
      a first interdigital electrode connected to said input terminal for converting an electrical input signal into travelling acoustic surface waves in a longitudinal direction of propagation;
      a first dummy electrode, comprising electrically shorted interdigital electrodes, arranged mutually adjacent to said first interdigital electrode in said longitudinal direction of propagation;
      a first reflector arranged on an outer side of said first interdigital electrode; and
      a second reflector arranged on an outer side of said first dummy electrode;
      said first longitudinal mode coupling type resonator being arranged to generate two longitudinal mode resonations;
   and wherein said second longitudinal mode coupling type resonator comprises:
      a second dummy electrode, comprising electrically shorted interdigital electrodes;
      a second interdigital electrode connected to said output terminal for converting said travelling acoustic surface waves into an electrical output signal, said second interdigital electrode being arranged mutually adjacent to said second dummy electrode in said longitudinal direction of propagation;
      a third reflector arranged on an outer side of said second dummy electrode; and
      a fourth reflector arranged on an outer side of said second interdigital electrode;
      said second longitudinal mode coupling type resonator being arranged to generate two longitudinal mode resonations;
   and wherein said first longitudinal mode coupling type resonator and said second longitudinal mode coupling type resonator being acoustically coupled and arranged mutually adjacent in a transverse direction perpendicular to said direction of propagation.

2. The surface acoustic wave resonator filter according to claim 1, wherein said first longitudinal mode coupling type resonator generates two resonance frequencies from multiple reflecting resonations between said first and said second reflectors, said first interdigital electrode and said first dummy electrode and a resonation of each of said first interdigital electrode and said first dummy electrode;
   wherein said second longitudinal mode coupling type resonator generates two resonance frequencies from multiple reflecting resonations between said third and fourth reflectors, said second interdigital electrode and said second dummy electrode and a resonation of each of said second interdigital electrode and said second dummy electrode;
   wherein a higher resonance frequency of said first longitudinal mode coupling type resonator is equal to a lower resonance frequency of said second longitudinal mode coupling type resonator.

* * * * *